United States Patent [19]
Taylor

[11] 3,939,438
[45] Feb. 17, 1976

[54] PHASE LOCKED OSCILLATOR

[75] Inventor: John Richard Taylor, Bishopstoke England

[73] Assignee: International Business Machines Corporation, N.Y.

[22] Filed: Jan. 23, 1975

[21] Appl. No.: 543,586

[30]     Foreign Application Priority Data
   Jan. 31, 1974   United Kingdom................ 4506/74

[52] U.S. Cl. .................... 331/14; 331/1 A; 331/10; 331/17
[51] Int. Cl.² ......................................... H03B 3/04
[58] Field of Search .................. 331/1 A, 10, 14, 17

[56]           References Cited
           UNITED STATES PATENTS
3,825,855   7/1974   Basset................................ 331/14
       FOREIGN PATENTS OR APPLICATIONS
220,074   10/1958   Australia............................. 331/14

*Primary Examiner*—John Kominski
*Attorney, Agent, or Firm*—Nathan N. Kallman

[57]           ABSTRACT

In a phase locked oscillator (PLO), the frequency of a voltage controlled oscillator (VCO) is changed in response to error signals indicating the phase error between the individual pulses of a stream of input pulses and the output pulses of the PLO. The running of the PLO is temporarily interrupted whenever the phase error exceeds a predetermined amount, and is restarted in phase with the next input pulse from the stream of pulses. A residual part of the error signal causing the interruption is accumulated so that after each interruption the frequency of the oscillator is closer to the frequency of the input stream of pulses. The process is repeated as required until phase lock is achieved.

12 Claims, 6 Drawing Figures

PHASE LOCKED OSCILLATOR

BACKGROUND OF THE INVENTION

1. Field of the Invention

This invention relates to a frequency controlled phase locked oscillator.

2. Description of the Prior Art

The phase locked oscillator (PLO) disclosed in this application, has been developed in particular to meet the requirements of a magnetic disk file in which the position of data transducers are controlled during "read" and "write" operations by a closed loop servo system which derives servo position information from servo tracks previously recorded on an available disk surface in the file.

A function of the PLO is to supply clock pulses of an appropriate frequency to the "write" channel of the disk file to control "write" operations, Synchronization of the PLO is achieved by controlling its frequency so as to be in phase with servo clock pulses derived from the servo tracks. Since the clock pulse frequency supplied to the write channel is considerably greater than the servo clock frequency, the actual synchronizing process is conducted by using a signal which is a subharmonic of the actual PLO signal. The clock pulses supplied by the PLO to the "write" channel are required to be of a stable frequency, and ideally there should be no short term variations in frequency due to slight misalignment of the servo clock pulses on the disk. Essentially this requirement means that the PLO should have a low bandwidth only responding to the long term variations produced by speed changes of the disk, for example.

Summary of the Invention

A phase locked oscillator circuit, according to the invention, comprises a voltage controlled oscillator (VCO) arranged to be controlled by an incoming controlling signal consisting of a stream of pulses of substantially constant repetition rate; means for comparing the phase of the output from the oscillator with the phase of the controlling signal and arranged to produce, on receipt of each pulse of the controlling signal, an error signal indicative of any phase error existing between the incoming pulse and the oscillator output; means for converting each phase error signal to a corresponding voltage and accumulating the voltages in a store which has a predetermined decay rate, the resulting error voltage being applied to the input of the oscillator so as to reduce the phase error; means for interrupting the oscillator output to the comparing means on detection of a phase error exceeding a predetermined amount and thereafter for resupplying the oscillator output to the comparing means in phase with a subsequent incoming control pulse, the arrangement being such that voltage is accumulated in the store until it is of sufficient magnitude to bring the frequency of the oscillator to the desired value to hold the phase lock.

Brief Description of the Drawing

The invention will be described in further detail with reference to the accompanying drawings, in which:

FIGS. 2a–i depict waveforms generated at various parts of the phase locked oscillator running in synchronism with the input controlling pulses;

FIGS. 5a–f depict waveforms illustrating the initial synchronization of the phase locked oscillator in FIG. 1.

Description of the Preferred Embodiment

Figure 1:
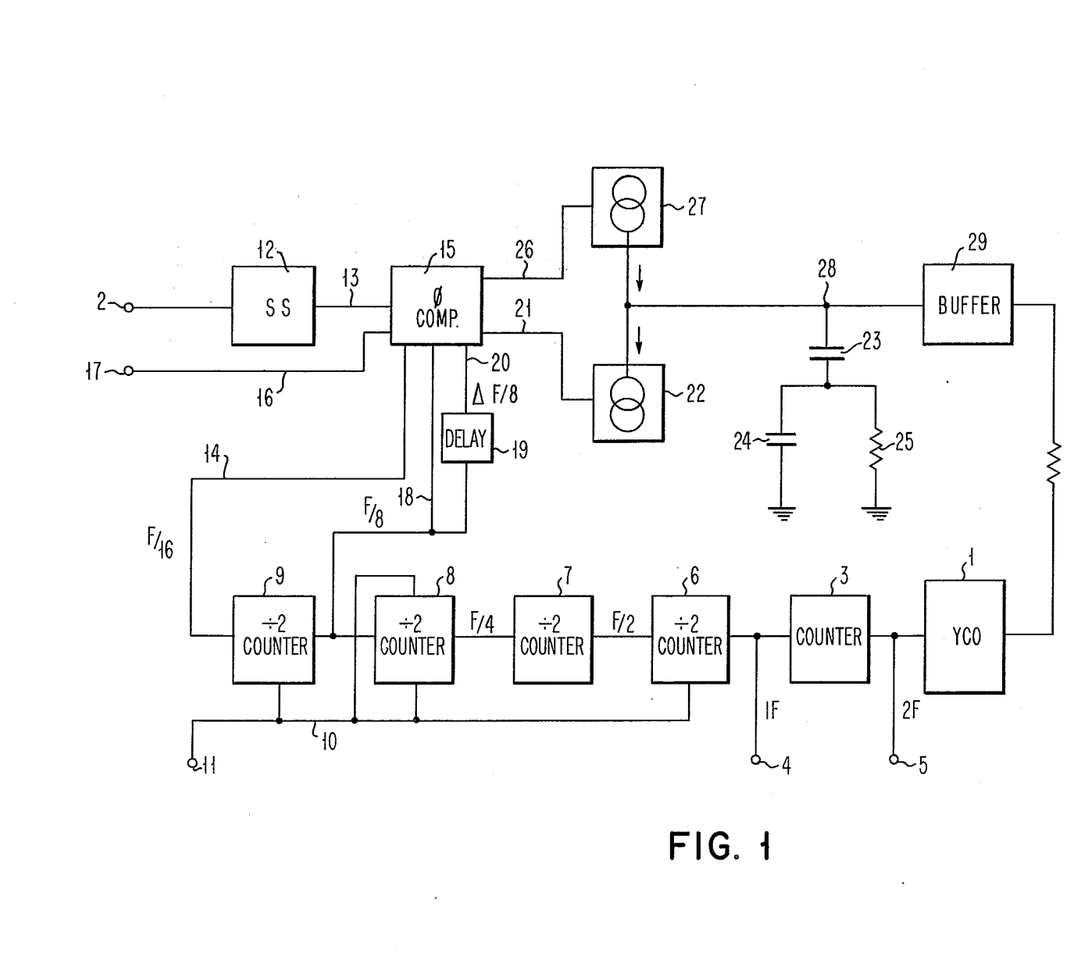
FIG. 1 is a block diagram of the phase locked oscillator, according to the invention.

The PLO loop block diagram shown in FIG. 1 includes a voltage controlled oscillator 1 which has a free-running frequency of 14.2 MHz, for example, which is to be synchronized with input pulses having a nominal frequency of 445 KHz supplied to input terminal 2. The oscillator output is initially divided by two by counter 3 and signals defined as the 1F and 2F write clock signals are taken from output terminals 4 and 5 respectively and used by the data channel of the disk file to control writing of data on the disk.

The source of synchronizing pulses applied as input to the terminal 2 of the circuit need not be described for the understanding of the invention. However, the controlling pulses in this particular apparatus are derived from servo information used to control the operation of a magnetic disk file. Servo information may be derived from servo tracks that are encoded on a magnetic disk surface by a servo head scanning the servo tracks. Essentially, the waveform derived from the servo pattern consists of negative clock pulses separated by positive position pulses, by way of example. The clock pulses are of constant amplitude, while the amplitude of the position pulses varies as an indication of the degree of offset from the desired position over the servo tracks. The clock pulses are not a continuous uninterrupted stream, but occasionally some are deliberately omitted to provide reference marks for the data channel of the file. Although only one clock pulse is omitted at any one time the possibility of occasional loss of a clock pulse due perhaps to a fault in the disk surface or to masking by noise cannot be ruled out. The PLO must be capable therefore of disregarding up to two missing clock pulses from the stream of clock pulses but to indicate a fault condition should three consecutive missing pulses be detected. This is achieved by logic circuitry which will be described in detail later.

Before a phase comparison can be made, the oscillator output is further divided by 16 to produce a signal of similar frequency to the 445 KHz servo clock signal. This is achieved by four conventional "divide by two" binary counters 6, 7, 8 and 9 which as a result of the division, supply F/2, F/4, F/8 and F/16 signals on their respective output terminals. A reset line 10 from terminal 11 is provided to set the counters 6, 7, 8 and 9 into logic states 0010 respectively. These are the states that the counters are in when the PLO is running in synchronization and a servo clock pulse is received at input terminal 2. Therefore, if the reset condition is removed on receipt of a servo clock pulse, the PLO will instantaneously be in phase with the input signal at terminal 2.

The input servo clock pulses supplied to input terminal 2 are not directly compared with the divided PLO signal but are applied to the input of single shot 12. Each negative going clock pulse fires the single shot producing a signal of approximately 600 nanosecs. duration on output line 13. The back edges of these signal shot pulses are used as reference for the synchronizing operation. The duration of the single shot is chosen so that when the PLO is running in synchronization with the input, the F/16 signal changes state midway between the occurrence of two servo position pulses.

The phase comparison between the pulses representing the input on line 13 and the F/16 oscillator pulses on output line 14 from counter 9 takes place in phase comparator 15. The comparison is started on receipt of a PLO run signal on line 16 from input terminal 17. The PLO run signal is obtained from a PLO start latch, referred to later with respect to FIG. 6, which is set whenever a synchronizing operation is to take place. The PLo run signal is also used to release the counters in their preset condition so that the PLO is initially in phase with the input. When the PLO run signal is dropped, the comparator is deselected and the counters 6, 7, 8 and 9 once more reset to binary states 0010.

It is convenient to use the F/8 signal appearing from counter 8 on output line 18 to perform the comparison since this signal always changes state midway through each pulse of the F/16 signal. Oscillator early and late pulses can therefore be obtained by logically comparing the occurrence of the F/8 signal edges with the single shot edges. In fact, oscillator early pulses are derived in this way, but oscillator late pulses are derived by comparing the occurrence of single shot edges with a slightly delayed F/8 signal. Accordingly, the F/8 signal on line 18 from counter 8 is also supplied to delay circuit 19, and the resulting delayed F/8 signal which will hereafter be referred to as the ΔF/8 signal is supplied to the comparator on input line 20. By using the ΔF/8 signal a small overlap of early and late pulses is obtained which avoids a small dead band in the response otherwise caused by logic delays.

Oscillator early pulses are supplied on output lines 21 and are arranged to switch on a current source 22 to draw current in the direction shown for the duration of the oscillator early pulse, thereby reducing the voltage on capacitor 23. This capacitor 23 forms a part of an integrating phase lead/lag network including a further capacitor 24 and resistor 25. Oscillator late pulses are supplied on output line 26 and switch on a second current source 27 which causes current to flow in the direction shown for the duration of the oscillator late pulse and increases the voltage on capacitor 23. The resulting voltage V appearing at terminal 28 is applied to the input of oscillator 1 through high impedance voltage buffer 29. The buffer 29 limits the leakage of current from capacitor 23 and the voltage changes the oscillator frequency in the appropriate direction to reduce the phase error. The component values of the circuitry are such that a voltage of approximately 50 mV changes the frequency of the oscillator by 1 percent.

Figure 2:
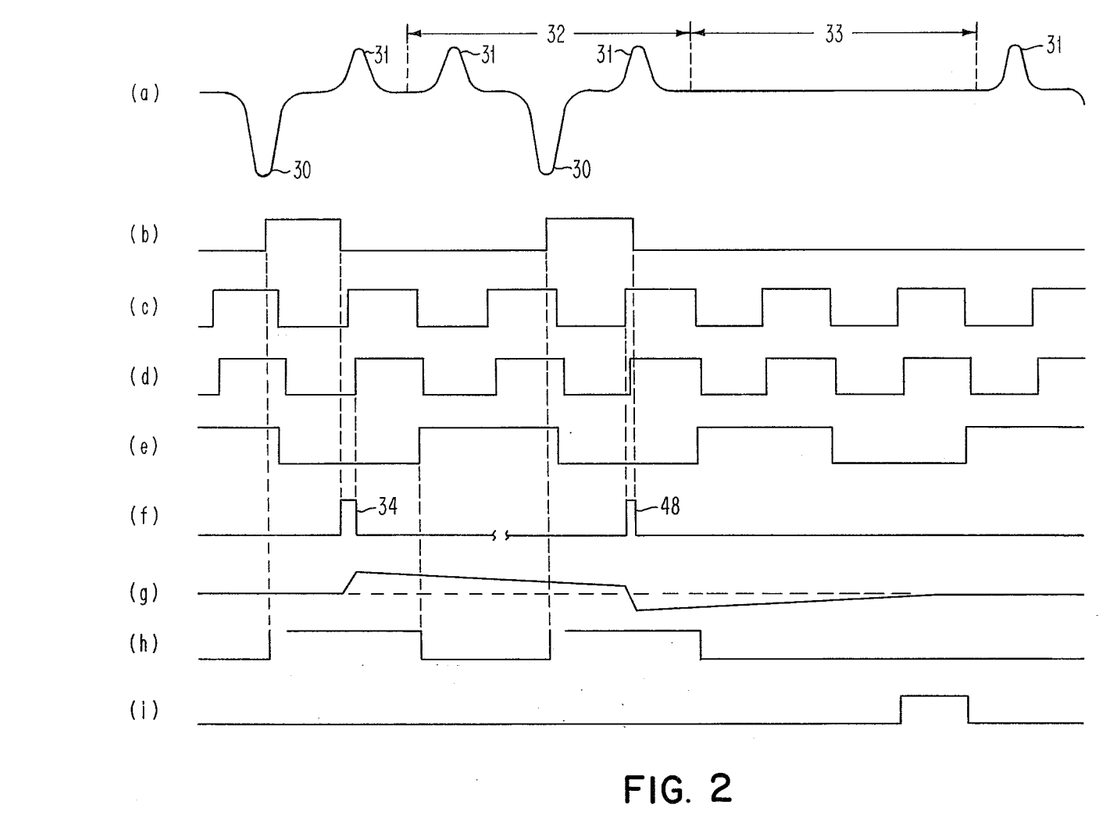

The waveforms in FIG. 2 represent the case when the PLO is running in synchronism with the servo input signal. Reference to these waveforms shows the logical requirements of the comparator 15 to produce the oscillator early and late pulses. Waveform 2a shows the input servo signal derived from the disk and is seen to consist of negative clock pulses 30 and positive position pulses 31. The particular section of the servo signal chosen for illustration includes a normal servo cell 32 containing a clock pulse 30 and two position pulses 31 and a missing clock cell 33 with, as the name implies, no clock pulse and no position pulses either.

The output from single shot 12 is shown as waveform 2b in FIG. 2. The F/8 oscillator signal appearing on line 18 is shown as waveform 2c. The ΔF/8 on line 20 is shown as waveform 2d. The F/16 signal appearing on line 14 is shown as waveform 2e. Although these waveforms represent the PLO running in synchronization with the input, in practice the oscillator is either slightly late or slightly early. In this example, it is seen that the oscillator is initially slightly late compared with the servo clock and the resulting oscillator late pulse 34 shown in waveform 2f. The resulting error voltage V used for correcting the frequency of the oscillator 1 is shown in waveform 2g. The effect of the frequency change in the example chosen is to overcorrect the oscillator frequency so that an occurrence of the next clock pulse, the oscillator signal is slightly early. The resulting oscillator early pulse 48 is also shown in waveform 2f. This waveform is shown broken, since in practice the oscillator early and late pulses appear from the phase comparator 15 on separate output lines 21 and 26 respectively. The resulting error voltage changes occurring at terminal 28 are again shown in waveform 2g. The voltage is seen to have changed from a positive to a smaller negative level in this waveform thus effecting the required "fine" correction to the oscillator frequency.

Figure 3:
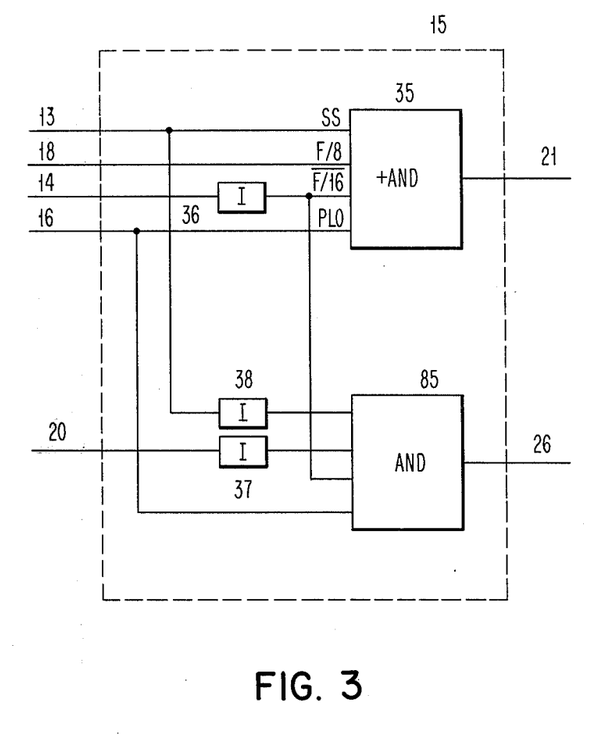
FIG. 3 is a block diagram of a phase compare circuit, forming part of the phase locked oscillator in FIG. 1.

The logical requirements of the comparator 15 to produce these oscillator early and late pulses are shown in FIG. 3. Reference to the waveforms in FIG. 2 show that oscillator early pulses are defined by the Boolean representation $\overline{SS}.F/8.\overline{F/16}$. PLO where SS represents the positive level of the single shot output on line 13, F/8 the positive level of the F/8 signal on line 18, $\overline{F/16}$ the negative level of the F/16 signal on line 14, and PLO the positive level of the PLO signal on line 16. This condition is detected by positive AND gate 35 supplied with the inputs shown. The F/16 signal on line 14 is inverted by inverter 36 before being supplied to the AND gate 35. Oscillator early pulses will be supplied on output line 21 in response to the signal levels defined above. Further reference to the waveforms of FIG. 2 shows that oscillator late pulses are defined by the Boolean representation $SS.\overline{\Delta F/8}.F/16$. PLO. This condition is detected by positive AND gate 85 with the ΔF/8 signal supplied on line 20 being inverted by inverter 37 and the single shot signal SS on line 13 being inverted by inverter 38. Oscillator late pulses are supplied on output line 26 in response to the signal levels defined by the oscillator late Boolean representation.

The remaining two waveforms 2h and 2i illustrate the operation of part of the logic circuitry used to indicate that a servo cell with a missing clock pulse has occurred and will not be described with reference to FIG. 4.

Figure 4:
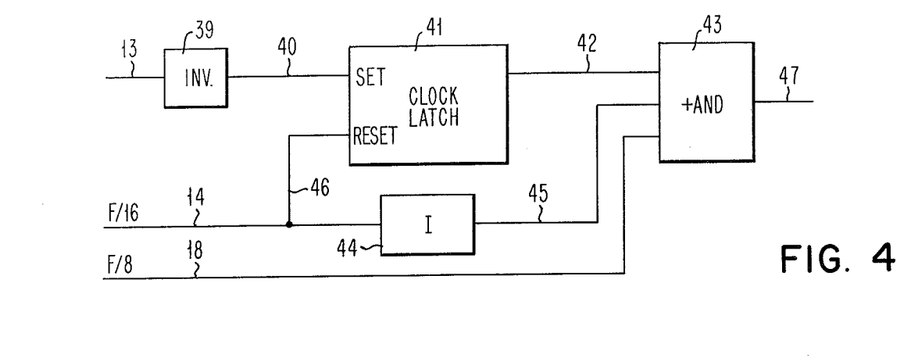
FIG. 4 is a block diagram of the logic circuitry for generating "missing" servo clock pulses.

In FIG. 4 the single shot output on line 13 is inverted by inverter 39 before being supplied as input on line 40 to a clock latch 41. The arrangement is such that a negative signal on output line 42 to one input of positive AND gate 43. The F/8 signal on line 18 also supplied as input to AND gate 43 and a third input, the F/16 signal on line 14 is inverted by inverter 44 and is supplied on line 45. The F/16 signal on line 14 is also supplied direct on line 46 to the reset of latch 41.

The AND gate 43 is conditioned to produce a negative output indicating a missing clock pulse when the output from the clock latch 41 is positive, that is, when the latch has not been set, the F/8 signal on line 18 is positive, and the F/16 signal on line 14 is negative and consequently the F/16 signal on line 45 is positive. The output from the clock latch 41 is shown as waveform 2h in FIG. 2. When a servo cell occurs with a "missing clock" pulse as shown in waveform 2a, the output from the single shot 12 is down and a positive input is applied on line 40 to the clock latch 41 which remains reset. The output on line 47 from AND gate 43 goes positive as a result indicating the occurrence of a "missing clock" pulse. The resulting missing clock pulse is shown as waveform 2i and remains positive for the duration of the negative level of the F/16 signal. The clock latch is set by the occurrence of the next single shot pulse.

The situation just described is when the oscillator is inphase with the input signals and only small correction pulses are required to maintain this condition. In practice, the synchronization process is allowed to continue until the oscillator signal is 90° out of phase with the input servo signal. That is, there is more than a quarter of a clock cell separating the synchronizing edges of the oscillator signal and the single show output. When this condition, known as the "out of window" condition occurs, the PLO run latch is reset and the synchronization process is temporarily interrupted. Inspection of the waveforms in FIG. 2 will show that the "window" is defined by the down level of the F/16 waveform 2e.

Figure 5:
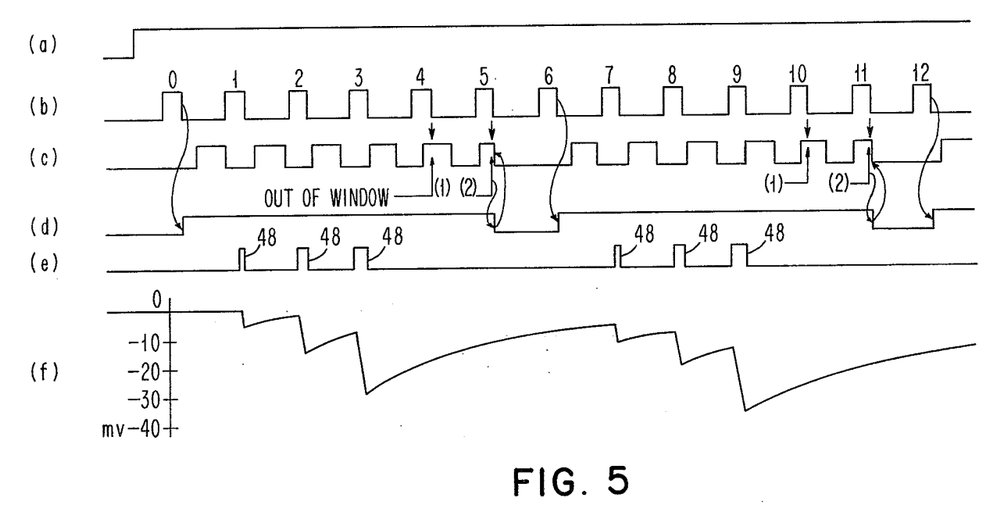

The first two cycles of the initial synchronizing process of the PLO will now be described with reference to FIGS. 5a–f. When the file is first switched on there can be up to 10 percent difference in frequency between the oscillator 1 and the input servo clock.

The synchronization process is started by raising the voltage on a PLO gate line which will be referred to later with reference to FIG. 6. The PLO gate line waveform is shown in waveform 5a. The PLO gate line signal is the reset to a start latch also shown in FIG. 6, the output of which is known as the PLO run and which controls the resetting of the four counters 6, 7, 8 and 9 to the preset condition 0010 as described previously, and also conditions the comparator 15 to compare the phase of the PLO and input signals. The output from the single shot 12 is shown as waveform 5b and the F/16 signal representing the PLO signal as waveform 5c. The start latch (FIG. 6) is set on occurrence of the first trailing edge of the single shot output and the resulting output known as PLO run is shown as waveform 5d. This releases the counters 6, 7, 8 and 9 starting the PLO initially in phase with the servo clock input. In this example, the PLO is initially running too fast and oscillator early pulses 48 are produced as previously described, which slow down the oscillator. The oscillator early pulses are shown in the first part of waveform 5d and the resulting error voltage V which appears at terminal 28 (FIG. 1) is shown below in waveform 5e. Each oscillator early pulse produces a change in voltage, the magnitude of which is proportional to the duration of the pulse and which decays at a rate determined by the RC of the lead/lag circuit described with reference to FIG. 1.

After four servo cells, a phase error of more than 90° has accumulated. There is of course the possibility that a servo clock may occur "out of window" due to a fault condition and accordingly the synchronization process is not interrupted until two consecutive servo pulses are detected "out of window." The logic circuitry for detecting this condition is shown in FIG. 6 and will be described in detail later. The effect of the detection is to reset the PLO run latch at the trailing edge of the single shot output from the fifth servo cell. The voltage on the PLO run line is therefore dropped and the counters 6, 7, 8 and 9 are reset to the binary values 0100 respectively. The second cycle of the synchronization process is commenced on the receipt of the single shot trailing edge from the sixth servo cell. The oscillator frequency is now nearer, as a result of the accumulated voltage on capacitor 23 resulting from the correction applied by the three oscillator early pulses. The plot of the error voltage V shown in FIG. 5e can be regarded as a graph of the oscillator frequency. As the second cycle of the synchronizing process continues, three more oscillator early pulses are produced before a phase error in excess of 90° is once again detected. Thus on occurrence of the eleventh cell the "out of window" detector logic causes the PLO gate to be dropped, the counters are once again reset and the process again started on occurrence of the trailing edge of the single shot output from the 12th cell. The process is repeated as many times as is necessary to build up the required voltage on capacitor 23 to bring the oscillator into synchronization with the input.

Figure 6:
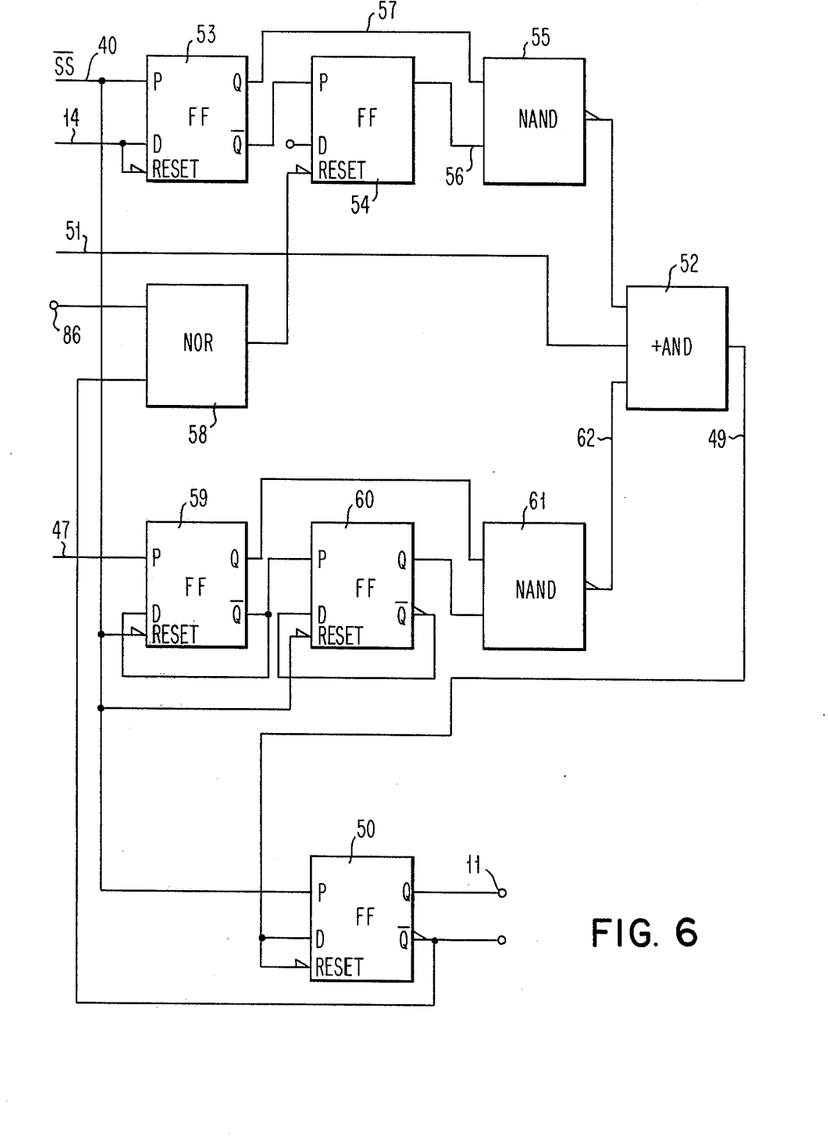
FIG. 6 is a block diagram of additional logic circuitry for controlling the operation of the phase locked oscillator in FIG. 1.

The logic circuitry for detecting two consecutive pulses "out of window" is shown in the upper part of FIG. 6. One input to AND gate 52 is the Select PLO signal supplied on line 51 which goes to a positive level when the file is switched on. The output line 49 from AND gate 52 is called the PLO gate line and is connected to a Data Input D and "reset" input of flip-flop 50 known as the PLO Run Latch. This latch has additionally a clock input P and two outputs Q and $\overline{Q}$. The arrangement of this type of flip-flop is such that the polarity on the data input D is transferred to the Q output, and its inverse to the $\overline{Q}$ output, on receipt of a positive going pulse applied to the clock input P. The latch is reset by a negative level on the reset input whereupon the Q output goes negative and $\overline{Q}$ goes positive. Several other flip-flops are included in the logic shown in FIG. 6 and all operate in this manner.

Prior to start-up of the file the PLO gate line 49 is negative and the PLO run latch 50 is in a reset condition. On start up, the select PLO line 51 is raised and, since no fault condition can exist at this time, the other two inputs to AND gate 52 are positive and its output, the PLO gate line 49 also goes positive. The inverted single shot pulses on line 40 (FIG. 4) are supplied to the clock input P of PLO run latch 50. On receipt of the trailing edge of the first single shot pulse which, being inverted is positive going, the polarity on the data input D is transferred to the Q output. The Q output line is connected to the reset terminal 11 of the PLO counters 6, 7, 8 and 9, and when at a negative level resets them to the state 0010 as explained earlier. As soon as the Q output from the PLO run latch 50 goes positive, the counters are released and the PLO oscillator starts running initially in phase with the servo clock input. The Q output line also provides the positive PLO run signal shown in waveform 5d.

The occurrence of two consecutive servo clock pulses "out of window" is detected by the two flip-flops 53 and 54 and the AND/INVERT Gate 55. The inverted single shot pulses on line 40 are applied to the clock input P of flip-flop 53. The F/16 oscillator signal on line 14 is applied to the data input D and also to the reset terminal of flip-flop 53. When the F/16 signal on line 14 goes positive, that is, during the "out of window" period, the data input to flip-flop 53 is at a positive level. Thus, when the inverted single shot output to input P goes positive, that is, on arrival of the trailing edge of the single shot, the Q output of flip-flop 53 goes positive and the $\overline{Q}$ output goes negative. Now, when the F/16 signal goes negative again, at the end of the "window," flip-flop 53 is reset and the Q output goes negative and the $\overline{Q}$ output goes positive. The $\overline{Q}$ output from flip-flop 53 is applied to the clock input P of flip-flop 54 which has its data input D permanently tied to a positive level. Accordingly, the Q output of flip-flop 54 goes positive and supplies a positive signal on one input 56 to positive AND/INVERT gate 55 indicating that one servo clock pulse has arrived "out of window." When the next servo clock pulse arrives "out of window" the Q output from flip-flop 53 once again goes positive and supplies a second input on line 57 to the two input gate 55. The output from AND gate 55 changes from a positive to a negative level indicating that two consecutive servo clocks have been detected "out of window" and that the oscillator is more than 90 inches out of phase with the input. Positive AND gate 52 is inhibited and the PLO gate line 49 drops resetting the PLO Run Latch 50, which on receipt of the next positive-going edge from the inverted single shot pulse applied to the clock input P causes the PLO run output line 11 to drop and the PLO counters to be reset.

The $\overline{Q}$ output from PLO run latch 50 will remain positive and after inversion by OR/INVERT gate 58 will reset flip-flop 54. A second input 86 is applied to the gate 58 to enable periodic reset of the flip-flop 54 so that spurious noise which caused pulses to be "out of window" are not accumulated.

If the servo clock input pulse is lost due to an electronic failure or partial servo track erasure, then one or more missing clock pulses will be generated as described with reference to FIG. 4. If there has been no input for three servo cells it is assumed that the input is lost and if nothing is done the PLO will drift out of synchronization. The remainder of the logic in FIG. 6 detects this condition and indicates the occurrence of a fault.

The logic in this case consists of two flip-flops 59 and 60 and an AND/INVERT gate 61. The flip-flops 59 and 60 are both reset by the negative edge of the inverted single shot pulse on line 40. That is, they are reset by the leading edge of the pulse and in this state the Q outputs will be negative and the $\overline{Q}$ outputs positive. The $\overline{Q}$ outputs from each flip-flop are connected back to their own data inputs D so that under normal conditions these are positive also. The missing clock pulses generated as explained with reference to FIG. 4 and supplied on line 47 are applied to the clock input P of flip-flop 59. The positive edge of the first missing clock pulse causes the positive signal at the Data input D of flip-flop 59 to be transferred to its Q output and accordingly the $\overline{Q}$ output and D input of flip-flop 59 both go negative. The $\overline{Q}$ output from flip-flop 59 is connected as the clock input P to flip-flop 60 which does not respond to the change from a positive to a negative level. The second missing clock pulse applied to the P input of flip-flop 59 causes the now negative level at D to be transferred to Q and $\overline{Q}$ to go positive. The positive signal now on the P input of flip-flop 60 causes the positive level at D to be transferred to the Q output of flip-flop 60. The third missing clock pulse applied to the P input of flip-flop 59 causes the Q output to go positive. The two inputs to the AND/INVERT gate 61 are now positive and its output on line 62 drops inhibiting the AND gate 52 indicating the fault condition. Again the PLO gate line 49 is dropped and the PLO run latch 50 is reset causing the PLO run line 11 to drop also. The PLO counters are reset to enable the oscillator to be started again in phase when the next clock pulse arrives.

While the phase locked oscillator, subject of this invention, has been described in relation to magnetic disk storage apparatus it will be apparent to those skilled in the art that its use is not so restricted. The invention may be used in any apparatus where synchronization of the frequency of a voltage controlled oscillator is required with a controlling signal.

What is claimed is:

1. A phase locked oscillator comprising:
   a voltage controlled oscillator arranged to be controlled by an incoming controlliing signal consisting of a stream of pulses of substantially constant repetition rate;
   means for comparing the phase of the output from the voltage controlled oscillator with the phase of the controlling signal and for producing on receipt of each pulse of the controlling signal, an error signal indicative of any phase error existing between the incoming pulse and the oscillator output;
   means for converting each phase error signal to a corresponding voltage and for accumulating the voltages in a store which has a predetermined decay rate, the resulting error voltage being applied to the input of the oscillator so as to reduce the phase error;
   means for interrupting the oscillator output to the comparing means on detection of a phase error exceeding a predetermined amount and for resupplying the oscillator output to the comparing means in phase with a subsequent incoming control pulse, such that voltage is accumulated in the store until it is of sufficient magnitude to bring the frequency of the oscillator to the desired value to hold the phase lock.

2. A phase locked oscillator as in claim 1, in which error signals representing phase lead conditions are produced on one output line from the comparing means, and error signals representing phase lag conditions are produced on another output line from the comparator, the duration of the error signals being directly proportional to the phase error detected.

3. A phase locked oscillator as in claim 1, in which the phase error converting means includes at least one current source adapted to cause current to flow in one direction through an associated circuit for the duration of phase lead error signals applied thereto and in the other direction in response to phase lag error signals applied thereto, the associated circuit including a charge storage device which generates a voltage proportional to the phase error in response to the current flow.

4. A phase locked oscillator as in claim 1, including means for supplying said error signals representing phase lead conditions to a first current source, adapted to cause current flow in one direction through a circuit, said circuit including a capacitor, by an amount proportional to the magnitude of each phase lead error; and means for supplying said error signals representing phase lag conditions to a second current source, adapted to cause current flow in the opposite direction through said circuit, so as to change the voltage across said capacitor by an amount proportional to the magnitude of each phase lag error, the error voltage applied to the input of the oscillator being derived from the voltage appearing across said capacitor.

5. A phase locked oscillator as in claim 1, in which the frequency of the oscillator output signal is substantially greater than the frequency of the incoming controlling signal including a number of binary counters for dividing the oscillator signal so as to produce a signal of similar frequency to that of the controlling signal prior to its application to the controlling means.

6. A phase locked oscillator as in claim 5, including means for interrupting said oscillator output signal, including means for holding said counters in a preset condition.

7. A phase locked oscillator as in claim 6, including means for restarting said counters on occurrence of a subsequent incoming pulse, the pre-set condition of said counters being such that the divided oscillator output supplied to the comparing means is in phase with said subsequent incoming pulse.

8. A phase locked oscillator as in claim 6, in which the oscillator output to the comparing means is interrupted on detection of a phase error exceeding ± 90°.

9. A phase locked oscillator as in claim 6, in which the oscillator output to the comparing means is interrupted on detection of two succeeding input pulses more than ± 90° out of phase with the oscillator output.

10. A phase locked oscillator as in claim 1, in which the stream of pulses of substantially constant repetition rate has one or more pulses omitted at intervals, comprising means for detecting and indicating when a pulse has been omitted from the stream.

11. A phase locked oscillator as in claim 10, including further circuitry responsive to indication of omitted pulses from said detecting and indicating means for inhibiting the interruption of the oscillator output to said comparing means until a predetermined number of consecutive omitted pulses have been detected.

12. A phase locked oscillator as in claim 1, including source means for deriving a stream of pulses of substantially constant repetition rate from information recorded on the surface of a movable recording medium.

* * * * *